(12) United States Patent
Dallas

(10) Patent No.: US 6,313,953 B1
(45) Date of Patent: *Nov. 6, 2001

(54) GAS CHEMICAL FILTERING FOR OPTIMAL LIGHT TRANSMITTANCE; AND METHODS

(75) Inventor: Andrew James Dallas, Apple Valley, MN (US)

(73) Assignee: Donaldson Company, Inc., Minneapolis, MN (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/231,737

(22) Filed: Jan. 15, 1999

(51) Int. Cl.⁷ .................................. G02B 1/06; G21G 5/00
(52) U.S. Cl. ...................... 359/667; 438/909; 250/492.2; 118/722; 430/128; 430/331
(58) Field of Search ............................. 359/667; 438/8, 438/115, 909; 250/492.2; 118/722; 430/128, 331

(56) References Cited

U.S. PATENT DOCUMENTS

| | | | |
|---|---|---|---|
| 3,413,059 | * 11/1968 | Berreman | 359/667 |
| 5,150,604 | * 9/1992 | Succi et al. | 73/38 |
| 5,166,530 | 11/1992 | McCleary | 250/492.2 |
| 5,415,772 | * 5/1995 | Garcera et al. | 210/232 |
| 5,456,740 | * 10/1995 | Snow et al. | 96/11 |
| 5,696,623 | 12/1997 | Fujie et al. | 359/350 |
| 5,810,031 | * 9/1998 | Evans et al. | 137/557 |
| 5,853,962 | * 12/1998 | Bowers | 430/331 |
| 5,871,587 | * 2/1999 | Hasegawa et al. | 118/719 |
| 5,902,551 | * 5/1999 | Cowan et al. | 422/103 |
| 5,906,429 | * 5/1999 | Mori et al. | 362/293 |

FOREIGN PATENT DOCUMENTS

| | | |
|---|---|---|
| 0 663 618 A1 | 7/1995 | (EP) . |
| 7-74077 | 3/1995 | (JP) . |

* cited by examiner

Primary Examiner—Evelyn A Lester
(74) Attorney, Agent, or Firm—Merchant & Gould P.C.

(57) ABSTRACT

Systems and methods of achieving optimal light transmittance through a gas and light transmittance region. This invention is directed at the application of specific activated carbon based materials for the protection of imaging lenses which are targeting optimal transmittance at specific wavelengths. Specifically, it outlines a use of a specific type of carbon to obtain improved/constant transmittance at a specific wavelength or range of wavelengths. In addition, it also presents the use of a mixture of activated carbon types in order to obtain improved/constant transmissions over a broad range of wavelengths.

12 Claims, 2 Drawing Sheets

GAS CHEMICAL FILTERING FOR OPTIMAL LIGHT TRANSMITTANCE; AND METHODS

FIELD OF THE INVENTION

This disclosure relates generally to methods using both filters and systems using filters. More specifically, this disclosure describes methods and systems for achieving optimal light transmittance at a specified wavelength or range of wavelengths through a gas and light transmittance region.

BACKGROUND

In the semiconductor industry, semiconductors are fabricated using a combination of lenses and other optical equipment. In many instances, it can be important to keep the lenses, optical equipment, and light transmission clear in order to achieve a quality image at a specified wavelength or range of wavelengths.

SUMMARY OF THE DISCLOSURE

This disclosure is directed to a method of achieving optimal light transmittance through a gas and light transmittance region. The method may include directing a method of optimal light transmittance through a gas and light transmittance region; the method including (a) selecting a media based on a desired light transmission wavelength; (b) directing a gas through the media to at least partially remove gaseous contaminants therefrom resulting in a purified gas; (c) directing the purified gas into a light transmission region; and (e) transmitting light through the light transmission region and purified gas.

Another aspect of the disclosure concerns a system for optimal light transmittance through a gas and a light transmittance region. One such system may include a filter construction for removing contaminants from the gas. The filter construction preferably includes a housing including and inlet connectable to a supply of gas and an outlet for exhausting gas received from the supply of gas. The filter construction also includes media. The media is selected accordingly to a desired operational light wavelength. The system also includes an illumination system for transmitting light through a light transmission region and the purified gas. The light transmission region is in gas flow communication with the filter outlet.

This invention is directed at the application of specific activated carbon based materials for the protection of imaging lenses which are targeting optimal transmittance at specific wavelengths. Specifically, it outlines a use of a specific type of carbon to obtain improved/constant transmittance at a specific wavelength or range of wavelengths. In addition, it also presents the use of a mixture of activated carbon types in order to obtain improved/constant transmissions over a broad range of wavelengths.

DETAILED DESCRIPTION

A. Some Problems with Existing Systems.

When fabricating semiconductors, a process called optical lithography is used. In this process, a photosensitive layer called photoresist is first spread on a wafer. Light is directed through a photomask to expose the resist in the regions of the wafer where some of the metal resistor layer must be removed. In these exposed regions, a photochemical reaction occurs in the resist that causes it to be easily dissolved in a developer solution. After the develop step, the photoresist remains only in the areas where a resistor is desired. The wafer is then immersed in an acid that etches the exposed metal layer but does not significantly attack the resist. When the etch is complete, the wafers are removed from the acid bath, rinsed, and the photoresist is removed by chemical or plasma techniques.

During this exposure process, the photoresist gives off gases, for example, acid gases, during exposure. These gases can deposit on or dissolve parts of the lens. To address this problem, in certain systems, a high purity gas, such as compressed nitrogen, argon, air, helium or hydrogen is constantly directed in a jet at the lens and light transmission region between the lens and substrate being exposed. This jet of high purity gas prevents the acid gases from the photoresist from attacking the lens by sweeping these gases away from the lens area.

If the compressed gas used to clean off the imaging lens is not sufficiently pure, residual hydrocarbons, such as hexane, dodecane, and toluene, for example, contained in the gas can collect on the lens and leave a film. The film over the lens negatively affects the imaging properties of the system. Also, hydrocarbons in the light transmission region between the lens and substrate negatively affects the imaging properties of the system. In certain instances, it has been found desirable to use a filter in the compressed nitrogen line to remove residual hydrocarbons. Improvements in filtering in these types of systems are desirable in order to effectively remove the residual hydrocarbons.

B. FIGS. 1–5

Figure 1:
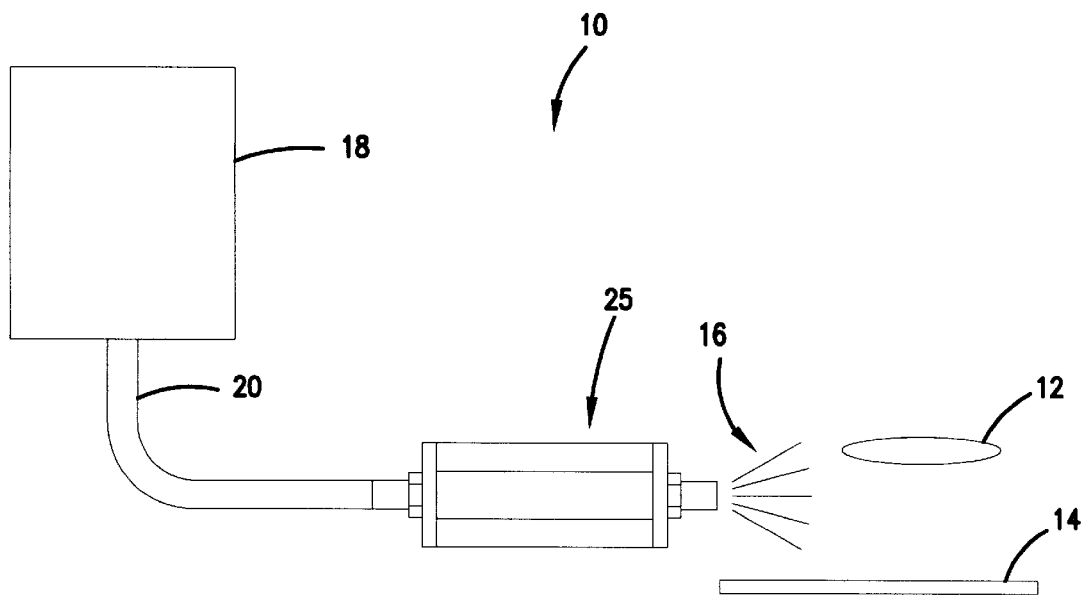
FIG. 1 is a schematic depiction of a system for removing gaseous contaminants from a high purity gas using a filter assembly.

Attention is directed to FIG. 1. In FIG. 1, portions of an optical lithography process are shown schematically at 10. The optical lithography process includes a lens 12 and a wafer or substrate 14. Substrate 14 will include a photoresist spread upon it. Light shines through the lens 12 and onto the substrate 14. As the photochemical reaction occurs on the substrate 14, acids are released into the atmosphere. These acids are prevented from attacking the lens 12 by a jet 16 of a high purity gas, such as nitrogen, argon, air, helium or hydrogen. A supply of the high purity gas is shown in the form of a tank at 18. The high purity gas is compressed and propelled through a conduit 20. In order to remove residual hydrocarbons from the gas, the gas is passed through a gas cleaner or filter system shown generally at 25.

In typical operations, the gas is under a pressure of between 90–110 psi and passes through the filter construction 25 at a rate of between 30 l/min and 200 l/min.

Figure 2:
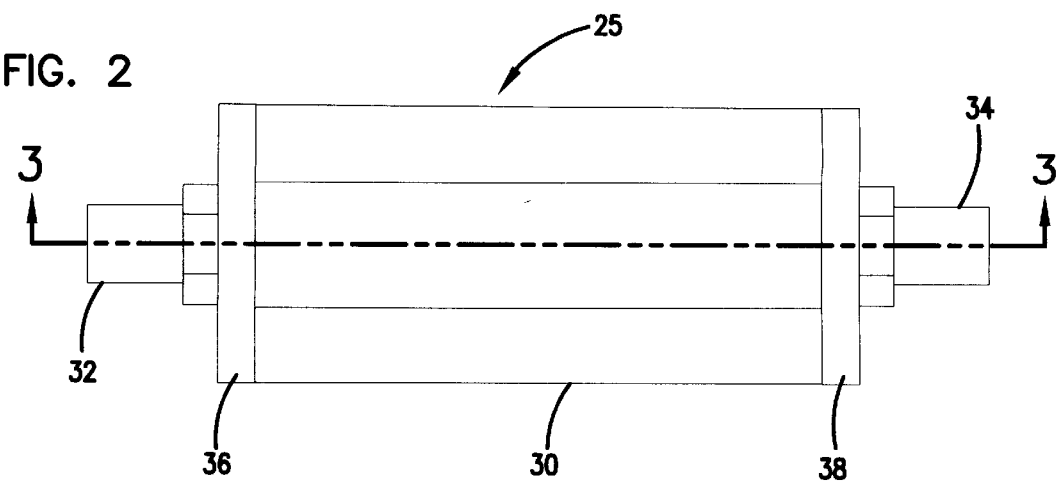
FIG. 2 is a side elevational view of one embodiment of the filter assembly depicted in FIG. 1.

Attention is directed to FIG. 2. FIG. 2 shows the filter system 25 in side elevation. In general, the filter system 25 is constructed and arranged to allow the passage of a gas therethrough, in line, regardless of the orientation of the filter system 25. In the embodiment illustrated in FIG. 2, the filter system 25 includes a filter housing 30, an inlet construction 32, and an outlet construction 34. As can be seen in FIG. 2, in the embodiment shown, the inlet construction 32 and the outlet construction 34 are on opposite ends of the housing 30. This allows for the air to flow in line or straight through. Also shown in FIG. 2 is a first end cap 36 oriented at the inlet end of the housing 30 and a second end cap 38 oriented at the outlet end of the housing 30.

Figure 3:
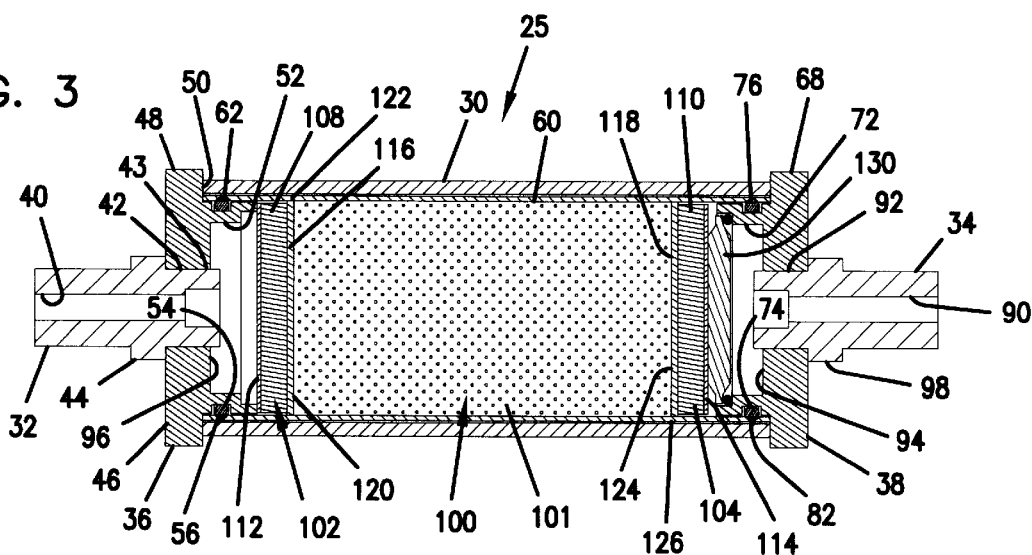
FIG. 3 is a cross-sectional view of the filter assembly shown in FIG. 2 taken along the line 3—3.

Attention is directed to FIG. 3. FIG. 3 is a cross-section of the filter system 25 taken along the line 3—3 of FIG. 2. As can be seen in FIG. 3, the inlet construction 32 defines a central aperture 40 to allow the passage of air therethrough. Preferably, the inlet construction is selectively attachable and removable from the first end cap 36. For example, the inlet construction 32 may include a threaded shank section 42 for threadably and operably connecting to the end cap 36. The inlet construction 32 includes a shoulder flange 44 that abuts an outer end surface 46 of the first end cap 36.

Figure 4:
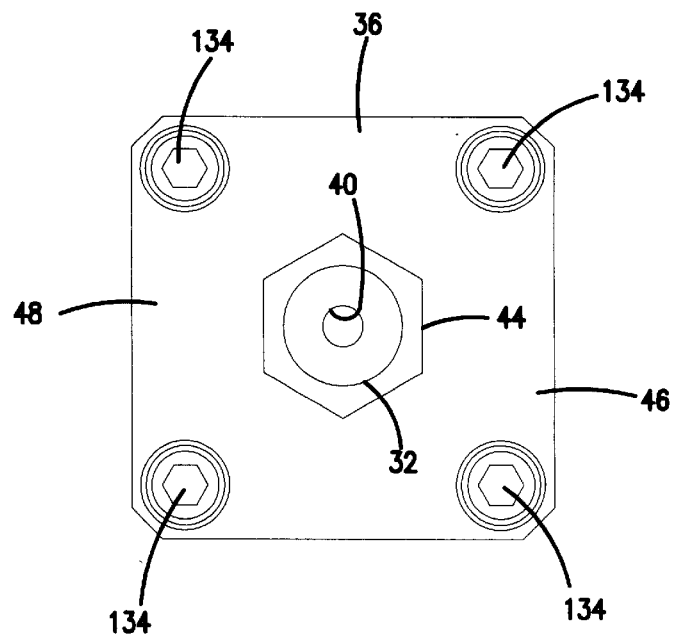
FIG. 4 is an end view of the filter assembly depicted in FIG. 2.

Typically, the first end cap 36 includes a shoulder or flange 48 that is for engaging or abutting an end 50 of the wall of the housing 30. As can be seem in FIG. 4, the flange 48 of the first end cap 36 is normally noncircular, in this case, rectangular or square. Typically, the housing 30 is also noncircular, and specifically, rectangular or square.

Referring again to FIG. 3, the first end cap 36 includes a wall 52 projecting from the flange 48. Namely, the wall 52 is continuous and surrounds or circumscribes the central aperture 43 of the end cap 36. As can be seen in FIG. 3, the wall 52 has a diameter less than the diameter of the flange 48. In this matter, the wall 52 is permitted to be received within the housing 30.

The first end cap 36 is constructed and arranged to hold a sealing member for forming a seal between the end cap 36 and a tubular construction in the housing 30. In particular, the wall 52 defines a gasket seat 54. Preferably, the gasket seat 54 is a region of reduced diameter in the wall 52 to form a cradle for holding a gasket or O-ring 56. The O-ring 56 compresses against an inner tubular construction 60 to form a seal 62 therebetween.

Still referring to FIG. 3, the tubular construction 60 preferably is a hollow tube having a continuous wall for holding and containing the inner filter components. The tubular construction 60 preferably fits snugly against the wall of the housing 30. Preferably, the tubular construction 60 engages and extends between first end cap 36 and second end cap 38.

The second end cap 38 is preferably constructed identical to the first end cap 36. As such, it includes a flange 68, a wall 72, and a gasket seat 74. An O-ring 76 cooperates with the tubular construction 60 to form a seal 82 therebetween.

The outlet construction 34 is preferably identical to the inlet construction 32. As such, the outlet construction 34 has a central aperture 90, a threaded shank section 92, and a shoulder flange 94.

As can be seen in FIG. 3, the inlet aperture 40 is in gas flow communication with an inlet passage 96 within the tubular construction 60 and within the wall 52 of the first end cap 36. Analogously, there is an outlet passage 98 within the tubular construction 60 and contained within the wall 72 of the second end cap 38. The outlet passage 98 is in gas flow or airflow communication with the outlet aperture 90.

In the optimal lithography process 10, there is a region of media for removing impurities within gas that passes through the filter 25. Preferably, the media includes a media pack 100 within the tubular construction 60. The media pack 100 operates to at least partially remove contaminants, such as residual hydrocarbons, from air or gas, such as nitrogen, flowing therethrough. Preferably, the media pack 100 comprises a particulate media 101, such as beaded media or granular media. More preferably, the particulate media comprises a beaded media 101 that is spherically shaped. In particular, one type of beaded media preferred is spherical carbon beads. The spherical carbon beads function to allow the flow of gas therethrough and absorb impurities, such as residual hydrocarbons, from the high purity gas.

Typically, the filter 25 includes a compression system within the filter 25 for exerting force on the media pack 100. The compression system maintains the media pack 100 to be maintained in a tight, packed condition between the individual beads in order to prevent leaks. The compression system allows the filter system 25 to be used in any orientation, by compressing on the media pack 100 from all directions. By compressing on the media pack 100 from all directions, the media pack 100 is prevented from settling. If the particulate media 101 were allowed to settle, a gas flow path may develop between the inlet construction 32 and outlet construction 34 without having to travel through any of the media 101.

In particular, in preferred systems, the compression system exerts force both upstream of the media pack 100 and downstream of the media pack 100. Also preferred is a compression system that is gas or air permeable. That is, the compression system preferably allows gas or air to freely flow therethrough. The preferred force of the compression system is preferably exerted from both directions and from the surrounding wall of the tubular construction 60 to put constant force on the particulate media to prevent settling. In certain embodiments, the compression system includes at least a single compression member. In the embodiment illustrated in FIG. 3, the compression system includes first and second compression members 102, 104. The first compression member 102 is located upstream of the media pack 100. The second compression member 104 is located downstream of the media pack 100. While a variety of implementations are envisioned, in the embodiment illustrated in FIG. 3, the first compression member 102 comprises a compressible pad 108 squeezed between the first end cap 36 and the media pack 100. Preferably, the compressible pad 108 is gas or air permeable. More preferably, the compressible pad 108 a circular open cell polyurethane pad having at least 30 pores per in., and preferably between 40–100 pores per in., for example, 50 pores per inch. Compressed within a filter system 25 as shown, the compression pad 108 will exert a force sufficient to compress the media pack 100. For example, certain usable compression pads 108 will exert a force of at least 10 N, and preferably between 10–35 N on the media pack 100.

As shown in FIG. 3, the second compression member 104 also includes a compression pad 110. The compression pad 110 is preferably identical to the compression pad 108. The compression pad 110 is downstream of the media pack 100 and compressed between the second end cap 38 and the media pack 100.

Also shown in FIG. 3, a porous screen 112 is compressed between the first end cap 36 and the pad 108. Analogously, there is a screen 114 pressed against the compression pad 110. Screens 112, 114 help to support the pads 108,110. The screens 112, 114 also provide some filtering function by preventing larger particles from passing therethrough. Preferably, the screens 112, 114 comprise a mesh of expanded metal.

The filter 25 also includes first and second regions of media, for example, depth media 116, 118 located upstream and downstream of the media pack 100. In the illustrated embodiment, the first region of depth media 116 is within a media disk 120. Media disk 120 has an outer surrounding housing 122 circumscribing the depth media 116. The depth media 116 assists to keep the particulate media, i.e. beads or grains, in the media pack 100 within the tubular construction 60. That is, the depth media 116 helps to contain or trap or prevent the particulate media 101 from passing therethrough and penetrating into the inlet passage 96. The depth media 116 is porous enough to permit the flow of gas therethrough without imposing an undue amount of restriction.

The second region of depth media 118 is preferably within a media disk 124 that is constructed analogously to media disk 120. As such, it includes an outer surrounding housing 126. The depth media 118 assists in preventing the particulate media 101 from traveling and embedding into downstream components.

The filter 25 also includes a system for collecting any particulates before being allowed to pass through the outlet passage 98 and in through the aperture 90. In the embodiment shown in FIG. 3, there is shown a filter disk 130. Preferably, the filter disk 130 operates as a sieve to collect the particles that may have made it through the upstream components of the filter 25. In certain preferred systems, the filter disk 130 includes a pleated metal screen. The screen will collect particles larger than at least 7 microns. Preferably, there are between 8–14 pleats, each having a pleat depth of preferably between 0.08–09.12 inches.

In reference again to FIG. 4, it can be seen that the end cap 36, and analogously the end cap 38, is releasably attached to the housing 30 through fasteners, such as screws 134.

Figure 5:
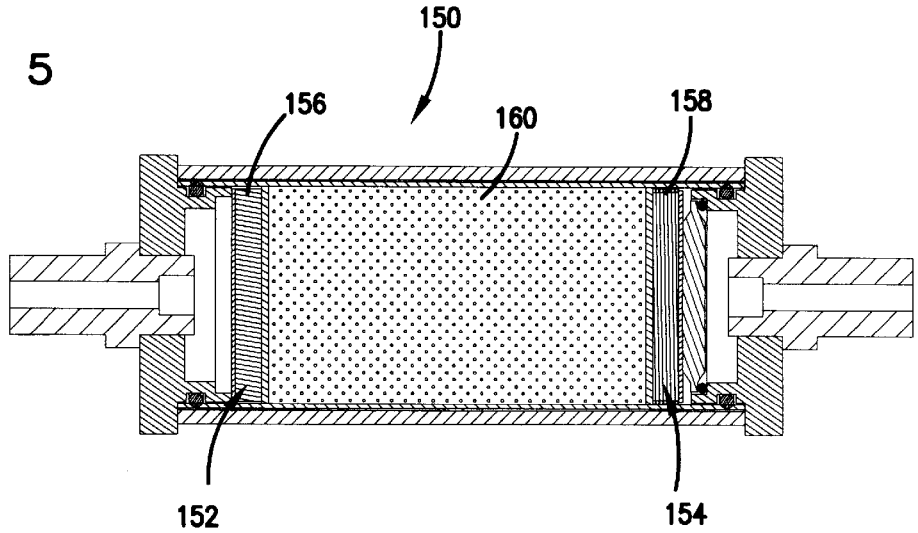
FIG. 5 is a cross-sectional view of another embodiment of a filter assembly, analogous to the view depicted in FIG. 3.

Turning now to FIG. 5, another embodiment of a filter is shown generally at 150. The filter 150 includes parts that are analogous to the filter 25, with the exception of the compression system. In the embodiment shown in FIG. 5, the compression system includes a first compression member 152 and a second compression member 154. The first compression member 152 preferably is a compression pad 156, analogous to the compression pad 108 and compression pad 110 of FIG. 3.

The second compression member 154 in this embodiment is preferably a spring 158. The spring 158 can be seen in cross-section as a coiled spring that exerts a force sufficient to compress the media pack 160. For example, forces of at least 10 N, preferably about 10–35 N are useful.

The spring 158 is advantageous in the process 10 because it is less prone to outgassing or offgassing. "Offgassing" is the release of gaseous contamination by facilities, equipment, tools, etc. during the semiconductor fabrication process.

In operation, the systems described herein operate to remove gaseous contaminants from a high purity gas. By "high purity gas", it is meant, for example, class 5 nitrogen or gas. By "gaseous contaminants", it is meant, for example, residual hydrocarbons. A high purity gas is directed into a filter construction, such as those described herein, having a region of media. The media is compressed both upstream of the region of media and downstream of the region of media. In this way, the filter construction may be used in any orientation, and there is no significant likelihood that the media will settle to allow gas a path to flow without being subject to the media. A high purity gas is directed through the region of media to at least partially remove gaseous contaminants therefrom. After the step of directing the high purity gas through the region of media, the high purity gas is directed out of the filter construction. The purified gas is directed into the light transmission region between the lens 12 and substrate 14.

In particular, in reference to FIG. 3, a high purity gas such as nitrogen passes through the inlet aperture 40 and into the inlet passage 96. There, it passes through the screen 112, through the compression pad 108, through the depth media 116, and into the media pack 100. The gas flows through the carbon particles of the media pack 100 where it is subject to having hydrocarbons and other contaminants absorbed by the carbon. The purified gas then passes through the second region of depth media 118 that removes any other particles that have made it through. The purified gas then passes through the second compression member 104, and through the screen 114, and through the filter disk 130. The filter disk 130 operates to remove any other particles larger than a certain size, such as 7 microns, from the gas. The purified gas then flows through the outlet passage 98 and out through the outlet aperture 90. From there, it may be sprayed onto a lens 12 and into the region between the lens 12 and substrate 14.

C. Optical Transmission Systems

In FIG. 1, portions of an optical lithographic process is shown schematically at 10. The systems and methods of this invention are best understood in conjunction with FIG. 1.

The systems of the invention include: a supply of gas 18, a filter 25, an illumination system, and a light transmission region. The filter construction 25 removes contaminants from the gas. The filter construction 25 includes a housing 30 having an inlet 32 in gas flow communication with the supply of gas 18, an outlet 34 for exhausting the gas, and a region of media 100 packed within the housing 30 downstream of the inlet 32. The media 100 and the filter construction 25 removes at least some contaminants from the gas which results in a purified gas exiting the filter construction 25. The systems of the invention also include a power source for the illumination system.

The illumination system is made of a device that transmits light, optically coupled to at least one lens. The illumination system transmits light through the lens 12 onto a substrate 14. The light transmission region is the area between the lens 12 and the working mount. The working mount is normally a substrate mount. The substrate mount holds the substrate 14 in place during processing. The purified gas is directed into the light transmission region. This purified gas prevents contaminant gases from the process from collecting on the lens. The light transmission region in normally in a vacuum chamber. The vacuum chamber is in gas flow communication to at least one vacuum pump.

Compressed gases can contain a range of volatile organic contaminations that are known to adsorb to surfaces. These contaminants can span a range in polarity, from nonpolar hydrocarbons such as hexane, octane and decane, to polar solvents such as methanol, acetone and toluene. The deposition of these contaminants on surfaces can present a problem in many instruments and/or application.

An example of an application where such a problem can occur, is imaging technology that incorporates optical lenses and therefore requires optimum control of the transmittance at a specific wavelength and/or a range of wavelengths. The typical nonpolar and polar volatile organic contaminants found in compressed gases can present transmittance problems for imaging applications. These adsorption problems arise at specific wavelengths and is evident in their UV absorbence spectrum.

Nonpolar hydrocarbon contaminants, such as pentane, hexane, octane, decane and cyclohexane, can pose light transmittance problems at light wavelengths less than 215 nanometers. More polar contaminants, such as methanol, acetone, toluene, isopropanol, ethyl acetate, carbon tetrachloride, dimethyl acetamide, dimethyl formamide, dimethyl sulfoxide, and N-methylpyrrolidone, also have a strong absorbence at these wavelengths; however, they also absorb light at a higher wavelength, presenting problems for optimum transmission at wavelengths above 215 nanometers.

The primary approach for reducing the level of contamination in gases is gas-solid adsorption. A wide range of adsorbent materials have been used to remove both specific contaminants and a broad range of contaminants from compressed gases. Of these materials, activated carbon materials are by far the most generally applied. Activated carbon can be prepared from natural and/or synthetic starting materials.

If optimal transmission is desired at a wavelength or wavelengths greater than 215 nanometers, a polar hydrocarbon removing media may work well by itself. Preferably, this polar hydrocarbon removing media is a carbon-based media. Preferably, this polar hydrocarbon removing carbon-based material is a synthetic polymeric carbon.

If optimal transmission is desired at a wavelength or wavelengths less than 215 nanometers, a combination of the carbon-based materials—that is, polar and nonpolar hydrocarbon removing media—offers the best range of filtration and, therefore, the greatest protection against the degradation of light transmissions over time. Preferably, this polar hydrocarbon removing media is a carbon-based media. Preferably, this polar hydrocarbon removing carbon-based material is a synthetic polymeric carbon. Preferably, the nonpolar hydrocarbon removing media is a carbon-based media. Typically, this nonpolar hydrocarbon removing carbon is a natural-based carbon.

When a combination of polar and nonpolar hydrocarbon removing media is used, the amount of material to be used in each filter system is dependent on the level and type of contaminant present in the gas stream being cleaned. Typically, these factors are not known and it is therefore preferable to initially use a filter that is comprised of equal amounts of natural and synthetic carbon-based materials. In applications where there is some knowledge regarding the type and amount of contamination present in the gas treatment, it may be desirable to weigh the amount of carbon-based material accordingly. For example, in the case where there is a large amount of polar organics and/or solvents, it may be beneficial to use a combination filter which is weighted sufficiently toward the polar surfaced carbon, such as a synthetic carbon. The combination filter should be used in a manner such that the gas stream is passed across or through the carbon material. These materials can either be layered or mixed, packed into a tube, bed, or coated onto surfaces. The materials can be granular, beaded, or fibrous, and any combination thereof.

D. Preferred Materials

In this section, example material specifications are provided. Of course, other materials may be used.

Preferably, the beaded media 101 comprises spherical carbon beads. Each of the carbon beads is between 0.5–0.7 mm in diameter. It has a dry apparent bulk density of 0.55–0.61 g/ml when tested per ASTM D2854. The moisture content preferably is 3% maximum by weight when tested per ASTM D2867.

Preferably, the polar hydrocarbon removing material is a synthetic polymeric carbon. Examples of specific synthetic polymeric carbons include carbonized/activated polystyrene divinyl benzene (Ambersorb carbons), Kureha beads, carbonized/activated rayon, polyacrylonitrile, phenolics, and other polymers. Polar hydrocarbon absorbing carbons are sold by Rohm and Haas under the trade name Ambersorb. Other suitable polar hydrocarbon absorbing carbon includes Kureha beads, Kynol activated carbon cloth, highly oxidized/activated carbon structures, carbons activated in gases such as ammonia, hydrogen sulfide, sulfur dioxide; and chemically treated carbons, such as impregnated with chemicals to remove specific vapors/gases.

Preferably, the nonpolar hydrocarbon adsorbing carbon is a synthetic polymeric carbon. Examples of specific nonpolar hydrocarbon adsorbing carbons include carbons sold by Barnebey Sutclife under the trade names 207C, 208C, 209C, MI, 978 carbons, and by Calgon under the trade names PCB and BPL carbons. Examples of specific natural carbons include coconut shell, peach pits, coal, wood, peat, etc.

Preferably, each of the compression pads 108, 110, 156 comprise an open cell polyester urethane, fully reticulated, with at least 30 pores per in, preferably 50 pores per in.

The filter disk 130 preferably comprises 0.16 in aluminum binding, having a screen of 325 by 2300 mesh, at least 7 microns, and about 8 microns, absolute. The screen pleat depth is approximately 0.10 in., and the screen material preferably comprises stainless steel 304.

Each of the media disks 120, 124 includes a region of depth media 116, 118, respectively. The depth media preferably comprises a blend of fibers, most preferably 50% polypropylene and 50% modacrylic. This fiber mixture exhibits a permanent electrical potential. The fomblin efficiency preferably is between 76–94% average, tested at 10.5 ft per min airflow, with 0.3–0.4 micron particles. There should be no single value below 71 or above 99. The permeability preferably is between 283–476 ft per min (86–145 meters per min). The thickness at 0.5 psi is preferably 0.035–0.061 in. (0.91–1.55 mm). The basis weight preferably is between 48–75 lbs/3000 ft sq (78–122 g/m$^2$). Preferably, each of the screens 112, 114 comprise expanded metal having a strand thickness of 0.028 in. (0.71 mm), and a percent open area of about 72%.

Preferably, the housing 30 is constructed of aluminum. Preferably, the tubular construction 60 is constructed of 304 stainless tubing, seamless, cold finished, annealed, and pickled. The material has a 20 gauge wall (0.035 in.).

Preferably, the O-rings 56, 76 comprise a synthetic rubber such as vinylidene fluoride-hexafluoropropylene, having a hardness of between 60 and 75 Shore A, for example VITON®, a registered trademark of DuPont, or FLUOREL®, a registered trademark of 3M. These materials are advantageous and preferred because they have low offgas potential.

Preferably, the first and second opposite end caps 36, 38 comprise stainless steel.

E. Example Preferred Constructions

It will be understood that wide variety of specific configurations and applications are feasible, using techniques and principles described herein. In this section, a particular filter assembly will be described.

The overall length of the filter system 25 between the tip of inlet 32 and the tip of outlet 34 is at least 2.79 in. (7.09 cm), for example 2.79–13.04 in. (7.09–33.12 cm), preferably 6.52 in. (16.6 cm).

The length of the filter system 25 between the end of end cap 36 and the end of end cap 38 is at least 2.0 in. (5.08 cm), for example 2.0–12.5 in. (5.08–31.75 cm), preferably 4.64 in. (about 11.8 cm).

Each of the end caps 36 and 38 have dimensions of between 1 by 1 in. (2.54 by 2.54 cm) to 6 by 6 in. (15.24 by 15.24 cm.) preferably 2 by 2 in. (about 5.1 by 5.1 cm).

Each of the compression pads 108, 110, 156 has a diameter of at least 0.5 in. (1.27 cm), for example 0.5–5.5 in. (1.27–13.97 cm.), preferably 1.52 in. (about 3.86 cm). Each of the compression pads has a thickness of at least 0.25 in.

(0.64 cm), for example 0.25–0.5 in.(0.64–1.27 cm), preferably 0.375 in. (about 0.95 cm).

The filter disk 130 has an outer diameter of at least 0.8 in. (2.03 cm), for example 0.8–5.25 in. (2.03–13.34 cm), preferably 1.365 in. (about 3.47 cm). The thickness of the filter disk is at least 0.05 in., for example 0.052–0.25 in., preferably 0.163 in. (about 0.414 cm.).

Each of the media disks 120, 124 has a diameter of at least about 0.5 in. (1.27 cm), for example 0.5–5.5 in. (1.27–13.97 cm), preferably 1.555 in. (about 3.95 cm).

Each of the screens 112, 114 has a diameter of at least 0.5 in. (1.27 cm), for example 0.5–5.5 in. (1.27–13.97 cm), preferably 1.52 in. (about 3.86 cm).

The tubular construction 60 has a length at least 1.2 in. (3.05 cm), for example 1.2–8.2 in. (3.05–20.83 cm), preferably 4.10 in. (about 10.4 cm). It has an inner diameter of at least 0.5 in. (1.27 cm), for example 0.5–5.5 in. (1.27–13.97 cm), preferably 1.555 in. (about 3.95 cm). It has an outer diameter of at least 0.55 in. (1.40 cm), for example 0.55–5.65 in. (1.40–14.35 cm), preferably 1.625 in. (about 4.13 cm).

Each of the O-rings 56, 76 has an inner diameter of at least 0.6 in. (1.52 cm), for example 0.6–5.25 in. (1.52–13.34 cm), preferably 1.239 in. (about 3.15 cm). Each of the O-rings 56, 76 has an outer diameter of 0.67–5.32 in. (1.70–13.51 cm), preferably 1.379 in. (about 3.50 cm).

Each of the inlets and outlets 32, 34 has a length of at least 0.25 in. (0.64 cm), for example 0.25–3.0 in. (0.64–7.62 cm), preferably 1.33 in. (about 3.38 cm). Each has an aperture diameter of at least 0.08 in. (0.20 cm), for example 0.08–0.5 in. (0.20–1.27 cm), preferably 0.19 in. (about 0.48 cm.).

I claim:

1. A method of optimal light transmittance through a gas and light transmittance region; the method including:
   (a) selecting a polar hydrocarbon adsorbing carbon media that comprises a synthetic polymeric carbon based on a light transmission wavelength that is greater than 215 nanometers;
   (b) directing a gas through the media to at least partially remove gaseous contaminants therefrom resulting in a purified gas;
   (c) directing the purified gas into a light transmission region; and
   (d) transmitting light through the light transmission region and purified gas.

2. A method of optimal light transmittance through a gas and light transmittance region; the method including:
   (a) selecting a media based on a light transmission wavelength that is less than 215 nanometers;
      (i) the media being selected from the group consisting of nonpolar hydrocarbon removing media, polar hydrocarbon removing media and mixtures thereof; the step of selecting further including selecting polar hydrocarbon removing media that comprises a synthetic polymeric carbon; and the step of selecting further including selecting the nonpolar hydrocarbon removing media that comprises a natural carbon;
   (b) directing a gas through the media to at least partially remove gaseous contaminants therefrom resulting in a purified gas;
   (c) directing the purified gas into a light transmission region; and
   (d) transmitting light through the light transmission region and purified gas.

3. A method of optimal light transmittance through a gas and light transmission region; the method including:
   (a) selecting a media based on a light transmission wavelength that is less than 215 nanometers;
      (i) the media comprising nonpolar hydrocarbon removing media and polar hydrocarbon removing media; and the step of selecting further includes selecting the polar hydrocarbon removing media that comprises a synthetic polymeric carbon; and the step of selecting includes selecting the nonpolar hydrocarbon removing media that comprises a natural carbon;
   (b) directing a gas through the media to at least partially remove gaseous contaminants therefrom resulting in a purified gas;
   (c) directing the purified gas into a light transmission region; and
   (d) transmitting light through the light transmission region and purified gas.

4. A system for optimal light transmittance through a gas and a light transmittance region; the system comprising:
   (a) a filter construction for removing contaminants from the gas; said filter construction including:
      (i) a housing having: an inlet connectable to a supply of gas; and an outlet for exhausting gas received from the supply of gas;
      (ii) a media, selected according to a desired operational light wavelength, within said housing downstream of said inlet; said media for removing at least some contaminants from the gas resulting in a purified gas;
         (A) the media being a polar hydrocarbon removing media that comprises a synthetic polymeric carbon; and
   (c) an illumination system for transmitting light through a light transmission region and the purified gas, wherein the light transmission region is in gas flow communication with said filter outlet;
      (i) the illumination system being constructed and arranged to transmit light at a wavelength greater than 215 nanometers.

5. The system of claim 4 further including a power source.

6. The system of claim 4 wherein the light transmission region is in a vacuum chamber, the vacuum chamber in gas flow communication to at least one vacuum pump.

7. A system for optimal light transmittance through a gas and a light transmittance region; the system comprising:
   (a) a filter construction for removing contaminants from the gas; said filter construction including:
      (i) a housing having: an inlet connectable to a supply of gas; and an outlet for exhausting gas received from the supply of gas;
      (ii) a media, selected according to a desired operational light wavelength, within said housing downstream of said inlet; said media for removing at least some contaminants from the gas resulting in a purified gas;
         (A) the media being selected from the group consisting of nonpolar hydrocarbon adsorbing media, polar hydrocarbon adsorbing media and mixtures thereof;
         (B) the polar hydrocarbon adsorbing media comprising a synthetic polymeric carbon and the nonpolar hydrocarbon adsorbing media comprising a natural carbon; and
   (c) an illumination system for transmitting light through a light transmission region and the purified gas, wherein, the light transmission region is in gas flow communication with said filter outlet;
      (i) the illumination system being constructed and arranged to transmit light at a wavelength less than 215 nanometers.

8. The system of claim 7 further including a power source.

9. The system of claim 7 wherein the light transmission region is in a vacuum chamber, the vacuum chamber in gas flow communication to at least one vacuum pump.

10. A system for optimal light transmittance through a gas and a light transmittance region; the system comprising:
 (a) a filter construction for removing contaminants from the gas; said filter construction including:
  (i) a housing having: an inlet connectable to a supply of gas; and an outlet for exhausting gas received from the supply of gas;
  (ii) a media, selected according to a desired operational light wavelength, within said housing downstream of said inlet; said media for removing at least some contaminants from the gas resulting in a purified gas;
   (A) the media comprising nonpolar hydrocarbon removing media and polar hydrocarbon removing media;
   (B) the polar hydrocarbon removing media comprising a synthetic polymeric carbon and the nonpolar hydrocarbon removing media comprising a natural carbon; and
 (c) an illumination system for transmitting light through a light transmission region and the purified gas, wherein, the light transmission region is in gas flow communication with said filter outlet;
  (i) the illumination system being constructed and arranged to transmit light at a wavelength less than 215 nanometers.

11. The system of claim 10 further including a power source.

12. The system of claim 10 wherein the light transmission region is in a vacuum chamber, the vacuum chamber in gas flow communication to at least one vacuum pump.

* * * * *